United States Patent [19]
Eitan et al.

[11] Patent Number: 5,453,636
[45] Date of Patent: Sep. 26, 1995

[54] MOS SRAM CELL WITH OPEN BASE BIPOLAR LOADS

[75] Inventors: Boaz Eitan, Ranana, Israel; Alexander Shubat, Fremont, Calif.

[73] Assignee: WaferScale Integration, Inc., Fremont, Calif.

[21] Appl. No.: 291,252

[22] Filed: Aug. 16, 1994

[51] Int. Cl.$^6$ ............... H01L 27/02
[52] U.S. Cl. ............ 257/378; 257/903; 365/154; 365/177; 365/182
[58] Field of Search .............. 257/378, 903, 257/904; 365/154, 155, 177, 182

[56] References Cited

U.S. PATENT DOCUMENTS 5,055,904  10/1991  Minami et al. ............... 257/378

FOREIGN PATENT DOCUMENTS 59-155166  9/1984  Japan ............... 257/903

OTHER PUBLICATIONS

E. Seevinck et al., *Static Noise Margin Analysis of MOS SRAM Cells*, IEEE Journal of Solid State Circuits, vol. Sc–22, No. 5, pp. 748–754, Oct. 1987.

Stephen Flannagan, *Future Technology Trends For Static Rams*, 1988 IEEE International Electron Devices Meeting Technical Digest, pp. 40–43.

*Primary Examiner*—Ngân V. Ngô
*Attorney, Agent, or Firm*—Skjerven, Morrill, MacPherson, Franklin & Friel; Alan H. MacPherson; David T. Millers

[57] ABSTRACT

An SRAM cell includes an open-base, bipolar transistor serving as a load device and one pull-down transistor having an associated leakage current. The amplification β of the bipolar transistor controls the amount of load current through the bipolar transistor. The bipolar transistor provides the necessary load current to ensure the SRAM cell maintains its logic state.

25 Claims, 11 Drawing Sheets

MOS SRAM CELL WITH OPEN BASE BIPOLAR LOADS

BACKGROUND OF THE INVENTION

1. Field of the Invention

This invention relates to a static random access memory (SRAM) cell and, in particular to an SRAM cell having open-base, bipolar load elements.

2. Description of the Prior Art

Static random access memory (SRAM) chips are well known in the art. An SRAM chip is conventionally structured in rows and columns of individual SRAM cells. A prior art six transistor SRAM cell is shown schematically in FIG. 1. SRAM cell 1 includes two p-type transistors 7 and 8, and four n-type transistors 5, 6, 9 and 10. SRAM cell 1 has two states: logic state "0" and logic state "1". By convention, if logic state "0" is designated by node A having a low voltage and node B having a high voltage, then logic state "1" has the opposite stored voltages, i.e. node A having a high voltage and node B having a low voltage.

In logic state "0" the low voltage on node A turns off transistor 9 and turns on transistor 7, whereas the high voltage on node B turns on transistor 10 and turns off transistor 8. Because transistor 10 is on and transistor 8 is off, current flows through transistor 10 to voltage supply Vss (ground), thereby maintaining a low voltage on node A. Because transistor 7 is turned on and transistor 9 is turned off, current flows from voltage supply Vcc through transistor 7, thereby maintaining a high voltage on node B.

To change the state of SRAM cell 1 from a logic "0" to a logic "1" bit line 3 and bit line 2 are provided with a high and a low voltage, respectively. Then, access transistors 5 and 6 are turned on by a high voltage on word line 4, thereby providing the high voltage on bit line 3 to node A and the low voltage on bit line complement 2 to node B. Accordingly, transistor 9 is turned on and transistor 7 is turned off by the high voltage on node A and transistor 10 is turned off and transistor 8 is turned on by the low voltage on node B, thereby switching the state of the circuit from logic "0" to logic "1". Following the switching of the state of cell 1, access transistors 5 and 6 are turned off (by applying a low voltage on word line 4). Cell 1 maintains its new logic state in a manner analogous to that described above.

FIG. 2 illustrates one example of a cell layout of the six transistor SRAM cell 1 shown in FIG. 1. For cell stability the driver transistors 9, 10 should have a W/L ratio at least a factor of 2 greater than the W/L ratio of access transistors 5, 6. See the article by E. Seevinck et al., entitled *Static Noise Margin Analysis of MOS SRAM Cells*, IEEE Journal of Solid State Circuits, Vol. SC-22, No. 5, at 748–54 (October 1987). The pullup transistors 7, 8 usually have the smallest W/L possible as allowed by the technology design rules.

SRAM cell 1 of FIGS. 1 and 2 occupies a large area on the chip surface due to the formation of the required six transistors, i.e. transistors 5–10. Moreover, node B, which is coupled to both transistors 7 and 10 as shown in FIGS. 1 and 2, requires a metal interconnect line between these two transistors. Using single layer metal technology, the six-transistor memory cell, i.e. SRAM cell 1, requires at least five widths of metal interconnect, which effectively determines the size of cell 1. These five widths include the metal for bit lines 2 and 3, the metal for nodes A and B, and the metal for voltage supply VSS. Using double layer metal technology (as in FIG. 2), the metal for bit lines 2 and 3 is positioned above the metal for nodes A and B. Thus, for double layer metal, SRAM cell 1 requires only three widths of metal interconnect.

In another prior art SRAM cell 12, shown in FIG. 3, p-type transistors 7 and 8 of FIGS. 1 and 2 are replaced by load resistors 13 and 14, wherein each resistor has a high resistance of, for example, $1 \times 10^8$ to $1 \times 10^{10}$ ohms. The replacement of transistors 7 and 8 with resistors 13 and 14 decreases the size of memory cell 12. However, the high resistance values of load resistors 13 and 14 increases the power consumption in cell 12. Although it is well known in the art to produce high resistance resistors on a small surface area by using ion-implanted polysilicon to provide the desired resistance level, there are a number of serious problems to be overcome.

For example, controlling the resistance of polysilicon during fabrication is extremely difficult. Although load resistors 13 and 14 may be fabricated from the same layer of polysilicon used to form the polysilicon gates of transistors 5, 6, 9, and 10, typically two polysilicon layers are necessary. Specifically, one polysilicon layer is used for load resistors 13 and 14 and another polysilicon layer is used for the gates of transistors 5 and 6, and supply voltage Vcc. For example, FIG. 4 illustrates a cross section of a portion of SRAM cell 12 having a first polysilicon layer 20 for supply voltage Vcc and gate G, and a second polysilicon layer 21 for a resistor R.

However, even if SRAM cell 12 is fabricated with two polysilicon layers, SRAM cell 12 still has several disadvantages. First, referring back to FIG. 3, load resistors 13 and 14 are fabricated by a complex process which produces devices having substantial variations in resistance. These variations result in low yield for such processes. Second, load resistors 13 and 14 must provide a current which is higher than the leakage current, i.e. typically in the range of $2-10 \times 10^{-14}$ amps, from nodes A and B while not exceeding a level of current that creates a stand-by current problem. Providing a suitable load resistor which has a high enough resistance to provide a current in this range is difficult because the load resistor must have a very high resistance, yet must occupy only a small area of the chip surface. As the density of SRAM cells in an array increases, the operating window for the resistance variation of load resistors becomes smaller. This phenomena is described in detail in an article by Stephen Flannagan, entitled *Future Technology Trends For Static Rams*, 1988 IEEE International Electron Devices Meeting Technical Digest, 40–43.

Integrating an electrically erasable programmable read only memory (EPROM) or flash EPROM cell into the same die with an SRAM cell further complicates the process of making an SRAM cell with polysilicon resistors. For example, a number of process steps performed during fabrication of a conventional EPROM or flash EPROM cell, in particular for a polysilicon floating gate and control gate, are incompatible with the process steps performed during fabrication of the high resistance polysilicon load resistors 13 and 14. To form an EPROM or flash EPROM cell requires two polysilicon layers. Specifically, to provide an SRAM cell with polysilicon resistors and an EPROM or flash EPROM cell on the same wafer requires three polysilicon layers: a first layer for the floating gate, a second layer for the control gate and word line, and a third layer for the polysilicon load resistor. Moreover, after fabrication of the high resistance polysilicon load resistors 13 and 14, cell 12 cannot tolerate any further high temperature processing steps. Thus, fabrication of an EPROM or flash EPROM cell on the same wafer as a polysilicon load resistor necessitates additional processing steps and significantly reduces the type of processing steps which can be performed.

Thus, a need arises for an SRAM cell load element which compensates for a leakage current and, at the same time, is easily integrated with an EPROM or flash EPROM cell on the same wafer, thereby reducing board size and providing faster performance at reduced cost.

SUMMARY OF THE INVENTION

In accordance with the present invention, an SRAM cell includes an open base bipolar transistor, which serves as a load device, and at least one field effect transistor. A common node connects the bipolar transistor and the field effect transistor. The bipolar transistor provides as much load current as is needed to compensate for the leakage current to the substrate or through the field effect transistor to keep the common node at the appropriate voltage level.

In one embodiment of the invention, the bipolar transistor has an N-type collector and emitter, and a P-type base. The collector-base junction is back biased, which in conjunction with the open base configuration, creates a slight positive voltage in the base, thereby lowering the barrier potential from the emitter to the base. The emitter-base junction is forward biased to allow current to easily flow across this junction. The amplification factor β of the bipolar transistor, determined by the ratio of the doping concentration of the emitter region to the doping concentration of the base region, controls the amount of load current through the bipolar transistor. If the amplification factor β is large enough, the load current compensates for the leakage current of the common node. A steady state is reached when the load current equals the leakage current.

In one embodiment of the invention the bipolar transistor load is directly connected (butted) to the pull-down drain without additional interconnect. As a result, the cell length requires only 2 metal pitches as compared to the conventional six-transistor cell that requires 5 metal pitches; hence, the cell is drastically smaller.

In another embodiment of the invention, to minimize the surface area of the SRAM cell, the field effect transistor is a "field-less" transistor, i.e., a transistor in which the gate electrode does not overlap the adjacent field oxide regions.

The present invention has several advantages. First, because of the physical proximity of the bipolar transistor to the common node, the bipolar transistor provides a load current which is affected by the same conditions, for example temperature, which affect the field effect transistor. Thus, the load current proportionately increases (or decreases) in response to an increase (or decrease) in leakage current.

Second, the processing steps used during fabrication of the open-base bipolar transistors are compatible with the processing steps used during fabrication of EPROM cells, thereby allowing both devices to be put on the same chip without affecting processing steps required to fabricate the EPROM cells. This fabrication process includes forming an emitter region in a semiconductor substrate, forming a base region in this emitter region, followed by forming a collector region in this base region. A conductive layer contacting the collector provides contact to a voltage supply. This simple process is compatible with formation of an EPROM cell which requires only two polysilicon layers.

Finally, the SRAM cell in accordance with the present invention is readily scaled up to very large arrays of memory cells. In one embodiment for example, each SRAM cell requires a load current of only $0.5 \times 10^{-12}$ amps. Assuming that 256K cells are formed in one chip, then a chip in accordance with the present invention requires a virtually negligible standby current of only 0.1 microamp. Thus, the present invention is readily applicable to very large memory chips.

DETAILED DESCRIPTION OF THE INVENTION

Figure 5:
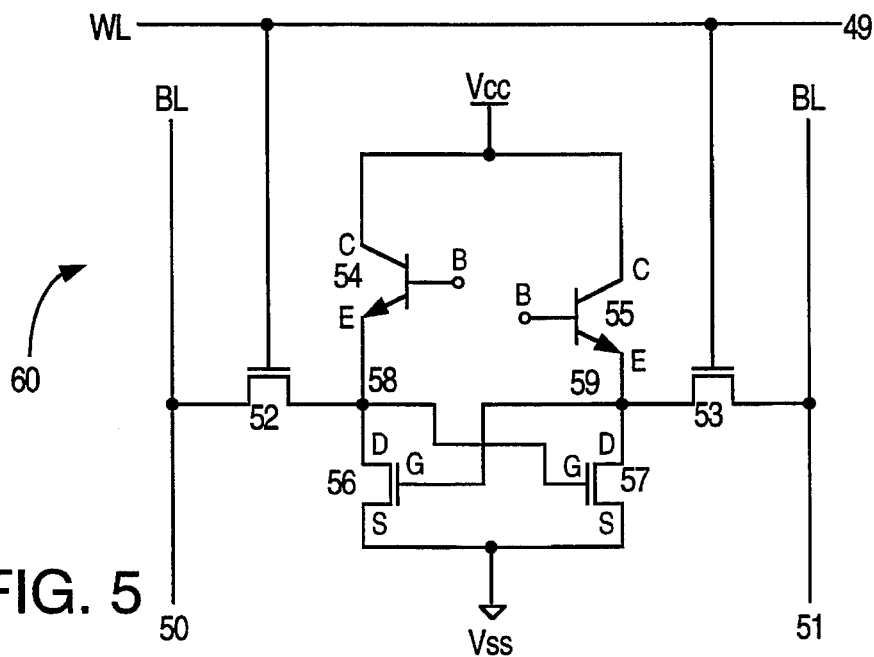
FIG. 5 illustrates schematically an SRAM cell in accordance with the present invention.

FIG. 5 illustrates schematically an SRAM cell 60 in accordance with the present invention. Access transistors 52 and 53 connect SRAM cell 60 to the bit lines 50 and 51, if a high voltage is provided to the gates of access transistors 52 and 53 via word line 49. SRAM cell 60 includes two pull-down field effect (n-type) transistors 56 and 57, and two bipolar pull-up transistors 54 and 55 acting as load devices. By convention, each bipolar transistor 54 or 55 has an emitter E, a collector C, and a base B. In accordance with the present invention, bases B of bipolar load transistors 54 and 55 are open, i.e. are not electrically connected.

In further accordance with the present invention, bipolar transistors 54 and 55 are NPN transistors i.e. having an N-type emitter E, a P-type base B, and an N-type collector C. The emitter E of bipolar transistor 54 is connected at common node 58 to the drain D of pull-down transistor 56.

Similarly, the emitter E of bipolar transistor 55 is connected at common node 59 to the drain D of pull-down transistor 57. The collectors C of bipolar transistors 54 and 55 are connected to the voltage source Vcc, typically 5 volts, while the sources S of pull-down transistors 56 and 57 are connected to voltage source Vss, typically ground. The gates G of pull-down transistors 56 and 57 are connected to common nodes 59 and 58, respectively.

Figure 5A:
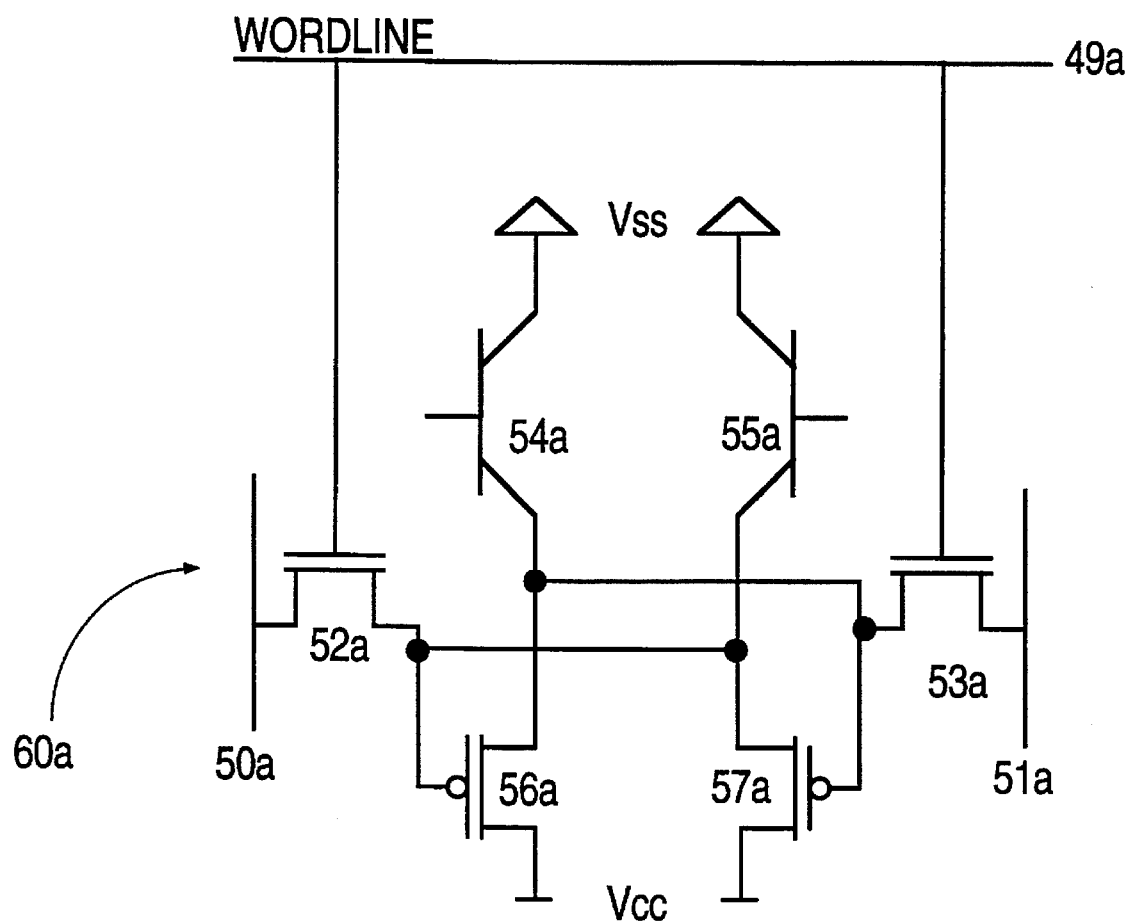
FIG. 5a illustrates schematically another embodiment of an SRAM cell in accordance with the present invention.

FIG. 5a illustrates schematically another embodiment of an SRAM cell 60a in accordance with the present invention. The SRAM cell 60a of FIG. 5a is the dual of the FIG. 5 SRAM cell 60, and uses p-channel transistors 52a, 53a, 56a, and 57a, and PNP bipolar transistors 54a and 55a.

Figure 6:
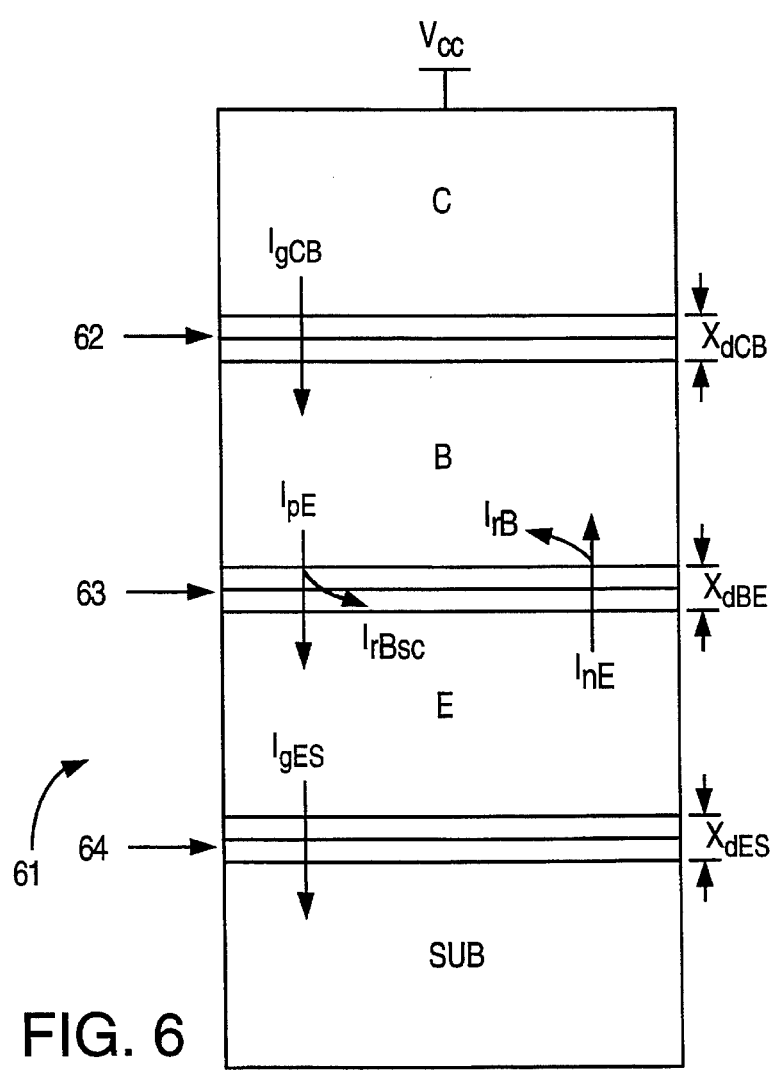
FIG. 6 illustrates a number of generation, diffusion, and recombination currents present in an NPN bipolar transistor.

An NPN bipolar transistor 61 in accordance with the present invention is shown schematically in FIG. 6. The collector/base junction 62 is back biased by connecting voltage source Vcc to the collector C. This back bias creates a junction leakage $I_{gCB}$ in which holes flow to base B and electrons flow to collector C. Because base B is floating, base B becomes slightly positive, thereby lowering the barrier potential from emitter E to base B. For example, in one embodiment, base B has a positive voltage of 100 millivolts. In this manner, the emitter/base junction 63 is forward biased. This lowering of the barrier potential and forward biasing of junction 63 creates diffusion currents $I_{pE}$ and $I_{nE}$ in which holes flow from base B to emitter E and electrons flow from emitter E to base B, respectively.

In accordance with the present invention which provides a compatible fabrication process for both EPROM or flash EPROM cells and SRAM cells, emitter E is adjacent substrate SUB. As a result, the junction leakage $I_{gCB}$ is directly related to the junction leakage $I_{gES}$ in which holes flow from emitter E to substrate SUB and electrons flow from substrate SUB to emitter E. The purpose of open-base bipolar transistor 61, as described in further detail below, is to compensate for this substrate leakage $I_{gES}$. Additional operating characteristics of open-base, bipolar transistor 61 are explained below via equations to illustrate the functionality of the present invention.

It is well known in the art that leakage current $I_{gCB}$, conventionally referred to as a generation current, is represented by the following equation:

$$I_{gCB} = \frac{A_c q n_i X_{dCB}}{2\tau_{CB}} \qquad \text{Eq. 1}$$

where $A_c$ is the area of collector C, q is the charge of an electron ($1.6 \times 10^{-19}$C), $n_i$ is the intrinsic carrier density of silicon ($1.5 \times 10^{10}$ cm$^{-3}$), $X_{dCB}$ is the depletion width between collector C and base B, and $\tau_{CB}$ is the effective minority-carrier lifetime in the depletion region.

In a similar manner, the generation current between emitter E and substrate S is represented by the following equation:

$$I_{gES} = \frac{A_s q n_i X_{dES}}{2\tau_{ES}} \qquad \text{Eq. 2}$$

where $A_s$ is the area of substrate S and $X_{dES}$ is the depletion width between emitter E and substrate S.

The injection current $I_{nE}$ in which electrons flow from emitter E into base B, conventionally referred to as a diffusion current, is represented by the following equation:

$$I_{nE} = \frac{A_E q D_n n_i^2}{N_{aB} X_{dBE}} (e^{qV_{BE}/kT} - 1) \qquad \text{Eq. 3}$$

where $A_E$ is the area of emitter E, $D_n$ is the diffusion constant for electrons (for lightly doped silicon at room temperature $D_n = 38$ cm$^2$/s, for example) $N_{aB}$ is the acceptor density in base B, $X_{dBE}$ is the depletion width between emitter E and base B, $V_{BE}$ is the voltage between base B and emitter E, k is Boltzmann's constant ($8.62 \times 10^{-5}$ eV/K), and T is temperature in Kelvin.

In a similar manner, the leakage current $I_{pE}$ in which holes from base B flow to emitter E, also conventionally referred to as a diffusion current, is represented by the following equation:

$$I_{pE} = \frac{A_E q D_p n_i^2}{N_{dE} X_{dBE}} (e^{qV_{BE}/kT} - 1) \qquad \text{Eq. 4}$$

where $D_p$ is the diffusion constant for holes (for lightly doped silicon at room temperature $D_p = 13$ cm$^2$/s) and $N_{dE}$ is the donor density in emitter E.

Finally, some electrons from diffusion current $I_{nE}$ recombine with holes in base B, thereby generating a recombination current $I_{rB}$ which is represented by the following equation:

$$I_{rB} = \frac{A_E q n_i^2 X_B}{2 N_{aB} \tau_b} (e^{qV_{BE}/kT} - 1) \qquad \text{Eq. 5}$$

It is also well known in the art that the widths of junctions 62, 63, and 64 ($X_{dCB}$, $X_{dBE}$, and $X_{dES}$, respectively) are represented by Equations 6, 7 and 8, respectively.

$$x_{dCB} = \left[ \frac{2\epsilon_s}{q} \left( \frac{1}{N_{aB}} + \frac{1}{N_{dC}} \right) (\phi_{iCB} - V_{CB}) \right]^{1/2} \qquad \text{Eq. 6}$$

$$x_{dBE} = \left[ \frac{2\epsilon_s}{q} \left( \frac{1}{N_{aB}} + \frac{1}{N_{dE}} \right) (\phi_{iBE} - V_{BE}) \right]^{1/2} \qquad \text{Eq. 7}$$

$$x_{dES} = \left[ \frac{2\epsilon_s}{q} \left( \frac{1}{N_{aS}} + \frac{1}{N_{dE}} \right) (\phi_{iES} - V_{ES}) \right]^{1/2} \qquad \text{Eq. 8}$$

where $\epsilon_s$ is the permittivity of silicon (i.e. 11.8 multiplied by $\epsilon_0$, wherein $\epsilon_0$ is the permittivity of air), $N_{dC}$ is the donor density in collector C, $N_{dE}$ is the donor density in emitter E, $V_{CB}$ is the voltage between collector C and base B, and $\phi i$ is represented by Equation 9 below:

$$\phi_i = \frac{kT}{q} \ln \left( \frac{N_a N_d}{n_i^2} \right) \qquad \text{Eq. 9}$$

Note that all leakage currents, as shown in Equations 1, 2, 3, and 4, are dependent upon junction widths (defined by Equations 6, 7, and 8). Thus, as explained in detail below, the value of these leakage currents is fundamentally process and voltage dependent. Referring to FIG. 6, diffusion current $I_{pE}$ is further defined as:

$$I_{pE} = I_{gCB} - I_{rB} \qquad \text{Eq. 10}$$

In other words, the hole current ($I_{gCB}$) which is not depleted by the recombination current ($I_{rB}$) flows to emitter E as hole current $I_{pE}$. Equation 10 exemplifies the principle that in a bipolar transistor there is no accumulation of charge.

To simplify the following analysis, the recombination current $I_{rB}$ is assumed to be negligible in comparison to the other referenced currents. This assumption is made because base B is very thin in relation to the thickness of collector C and emitter E (explained in detail in reference to FIGS. 8a–8d). Thus, $$I_{pE} = I_{gCB} \qquad \text{Eq. 11}$$

In other words, a pure transfer of holes is assumed to take place between collector C and emitter E.

For this steady state current $I_{pE}$ to flow to emitter E, the base to emitter potential, referring back to Equation 4, is voltage $V_{BE}$. Thus, referring back to Equation 3, the electron injection current from emitter E to base B is current $I_{nE}$. The relationship between $I_{pE}$ and $I_{nE}$ is represented by the equation below:

$$I_{nE} = I_{pE} \times \beta \qquad \text{Eq. 12}$$

where $\beta$ is $N_{dE}/N_{aB}$, i.e. the ratio of the emitter concentration to the base concentration (explained in detail in reference to Equation 18 and FIG. 9) and is referred to as the amplification of the bipolar transistor. Thus, by designing the process to provide an appropriate amplification $\beta$, a small leakage current $I_{pE}$ creates a large leakage current $I_{nE}$. In view of Equations 11 and 12, it logically follows that:

$$I_{nE} = \beta I_{gCB} \qquad \text{Eq. 13}$$

Referring back to FIG. 6, in a steady state system, the amount of electron current going to collector C ($I_c$) is equal to the hole current going to substrate S ($I_{gES}$). Thus, $$I_{gES} = I_{nE} - I_{rB} + I_{gCB} = I_c \qquad \text{Eq. 14}$$

Once again, recombination current $I_{rB}$ is assumed to be negligible. Moreover, because the amplification $\beta$ is assumed to be significant, current $I_{gCB}$ is also assumed to be negligible in relation to current $I_{nE}$. Therefore, $$I_{nE} \approx I_{gES} \qquad \text{Eq. 15}$$

Thus, combining Equations 13 and 15 yields $$I_{gES} = \beta I_{gCB} \qquad \text{Eq. 16}$$

Then, substituting Equation 6 (junction width $X_{dCB}$) in Equation 1 (current $I_{gCB}$), and substituting Equation 8 (depletion width $X_{dES}$) in Equation 2 (generation current $I_{gES}$), provides the following relationship:

$$\frac{A_s q n_i}{2\tau} \left[\left(\frac{1}{N_{aS}} + \frac{1}{N_{dE}}\right)(\phi_{iES} + V_{ES})\right]^{1/2} = \qquad \text{Eq. 17}$$

$$\beta \frac{A_c q n_i}{2\tau} \left[\left(\frac{1}{N_{ab}} + \frac{1}{N_{dC}}\right)(\phi_{iCB} + V_{CB})\right]^{1/2}$$

where $\beta$ is defined below by the donor and acceptor densities of emitter E and base B, respectively $$\beta = \frac{N_{dE}}{N_{aB}} \qquad \text{Eq. 18}$$

and $\phi_{iES}$ and $\phi_{iCB}$ are defined as in Equation 9. Note that in Equation 17 the donor densities in emitter E and collector C are assumed to be one or more orders of magnitude larger than the acceptor densities in substrate S and base B. Thus, for simplicity, the terms $1/N_{dE}$ and $1/N_{dC}$ are ignored. Using Equation 17, substituting the value for $\beta$ provided by Equation 18, and solving for voltage $V_{CB}$ yields $$V_{CB} = \left[\frac{A_s N_{aB}}{A_c N_{dE}}\right]^2 \left[\frac{N_{aB}}{N_{aS}}\right](\phi_{iES} + V_{ES}) - \phi_{iCB} \qquad \text{Eq. 19}$$

Equations 1–19 establish the relationships between the leakage components in the SRAM cell (i.e. node 59) and the bipolar process parameters.

As mentioned previously, two key conditions must be met for bipolar transistor 55 (FIG. 5) to be an effective load device. First, node 59 must be held at a high voltage if transistor 57 is off. Second, node 59 must not experience a leakage current (if node 59 is low) that is too high to meet a conventional standby current requirement. Comparable conditions must be met for bipolar transistor 54 to be an effective load device.

For illustrative purposes, the components of Equation 19 are presumed to have the following values: area $A_s$ is assumed to be five times greater than area $A_c$, $N_{aB}=1\times10^{16}$, $N_{aS}=5\times10^{15}$, $N_{dE}=1\times10^{19}$ (i.e. $\beta=1000$), $\phi_{iES}=0.856$, and $\phi_{iCB}=0.26$. Thus, only voltages $V_{CB}$ and $V_{ES}$ remain unknown.

Referring to FIG. 6, note that the supply voltage and the voltages across the various junctions have the following relationship:

$$V_{ES} = V_{CC} - V_{CB} - V_{BE} \qquad \text{Eq. 20}$$

Assuming that transistor 57 (FIG. 5) is off and a supply voltage Vcc of five (5) volts is provided, the optimal condition is for node 59 to have a high voltage of, for example, four volts (i.e. $V_{ES}=4.0$). Thus, only one (1) volt is left to share between voltages $V_{CB}$ and $V_{BE}$ to maintain a high enough current $I_{nE}$ to compensate for current $I_{gES}$. Therefore substituting all illustrative values into Equation 19 yields $$V_{CB} = \left[\frac{5}{1000}\right]^2 \left[\frac{1 \times 10^{16}}{5 \times 10^{15}}\right](0.856 + 4.0) + 0.934 \approx 0.931 \qquad \text{Eq. 21}$$

which meets the above-mentioned requirement. Table 1 illustrates that a wide range of amplifications $\beta$ provide an appropriately low voltage $V_{CB}$.

TABLE 1

| $V_{CB}$ | $\beta$ |
|---|---|
| 0.935 | 100 |
| 0.954 | 50 |
| 1.014 | 25 |
| 1.059 | 20 |
| 1.434 | 10 |

Thus, to maintain a high steady state voltage on node 59 (i.e. approximately 3.5 volts for voltage supply Vcc of 5.0 volts) with transistor 57 off and assuming a potential drop, i.e. voltage $V_{CB}$, of about 1.4 volts, an amplification $\beta$ of about 10.0 is required. As shown above in Table 1, a satisfactorily low voltage $V_{CB}$ is obtained without the need for a high amplification $\beta$. As is well known to those in the art, the minimum amplification $\beta$ is further lowered by improving the area ratio between the collector/base to emitter/substrate, i.e. by improving layout to minimize the ratio As/Ac (see Equation 19). Therefore, as shown above, the injection currents are fundamentally process driven by the junction areas and the doping concentrations (providing amplification β). Specifically, if the amplification β is large, the effect of a change in β on voltage $V_{CB}$ is negligible. However, as the amplification β becomes smaller, the effect of a change in β on voltage $V_{CB}$ becomes more noticeable.

The other steady state condition of interest in the open-base, bipolar transistor occurs if transistor (FIG. 5) is on, thereby pulling the voltage on node 59 to ground. As noted previously, in this steady state condition, node 59 must not experience a leakage current that is too high to meet a conventional standby current requirement. Thus, the value of leakage current $I_{gES}$ (Equation 16) becomes critical. As shown in Equation 16, to solve for the leakage current $I_{gES}$, the generation current $I_{gCB}$ must first be obtained. Therefore, the value for junction width $X_{dCB}$ (Equation 6) is substituted into Equation 1 (generation current $I_{gCB}$). Assuming $N_{aB}=1\times10^{16}$, $N_{dC}=\infty$, $V_{CB}\approx V_{cc}=5.5$ V, $\phi_{iCB}=0.934$, $\epsilon_S=1.03\times10^{-12}$, and $q=1.6\times10^{-19}$ C yields:

$$X_{dCB} = \left[\frac{2\times 1.03\times 10^{-12}}{(1.6\times 10^{-19})} \frac{1}{(1\times 10^{16})} (.934 + 5.5)\right]^{1/2} \text{Eq. 22}$$

$$= .912\times 10^{-4} \text{cm}$$

Therefore, assuming $A_c=5\times10^{-8}$ cm$^2$, $$I_{gCB} = \frac{(5\times 10^{-8})(1.6\times 10^{-19})(1.45\times 10^{10})(0.912\times 10^{-4})}{2\times 10^{-6}} \text{Eq. 23}$$

$$= 5.296\times 10^{-15} A.$$

Thus, referring back to Equation 16 and assuming an amplification β of 100 provides a leakage current of:

$$I_{gES} \cong \beta I_{gCB} = 0.529 \text{ picoamps} \quad \text{Eq. 24}$$

Thus, because current $I_{gES}$ is a very low leakage current, an SRAM cell in accordance with the present invention is readily scaled up to very large arrays of memory cells. In accordance with the above-described embodiment, each SRAM cell 60 (FIG. 5) under typical conditions requires a load current of only $0.5\times 10^{-12}$ amps. Assuming that 256K SRAM cells are formed in a single chip, an SRAM chip in accordance with the present invention requires a virtually negligible standby current of only 0.1 microamp. Note that this standby current is well below the standard standby current of 10 microamps for such an SRAM. Thus, the present invention is readily applicable to very large memory chips.

Significantly, the bipolar transistor is affected by the same conditions, for example temperature, which affect the common node 58 or 59. Specifically, assuming a physical proximity of the bipolar transistor to the substrate of approximately 0.5 microns, the leakage currents $I_{gCB}$ and $I_{gES}$ experience a similar lifetime in silicon (i.e., τ), and are affected by the same process steps. Thus, the load current of the bipolar transistor proportionately increases (or decreases) in response to an increase (or decrease) of leakage current at the common node. In this manner, the open base bipolar transistor acts as a self-adjusting load element.

Another advantage of this structure is that the above-described bipolar transistor has a very small surface area because open base B requires no metallization contact area. Yet another advantage is that fabrication of a bipolar transistor principally comprises simple diffusion process steps, thereby reducing process complexity and cost. This fabrication is described below in detail in reference to FIGS. 8a–8d.

Figure 1:
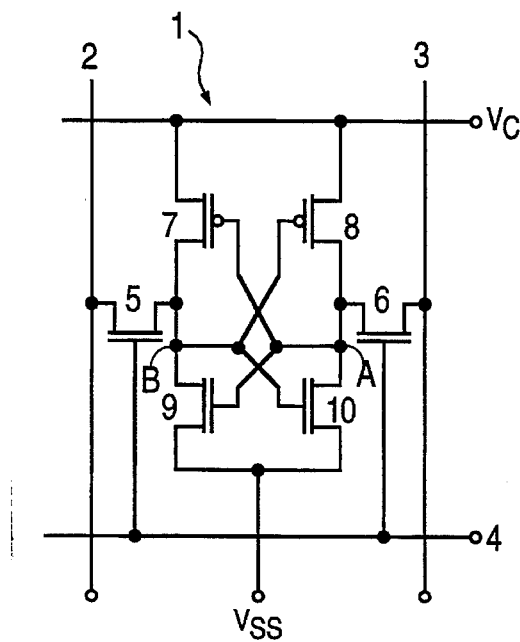
FIG. 1 illustrates a prior art SRAM cell in which p-type transistors are used as load devices.
Figure 2:
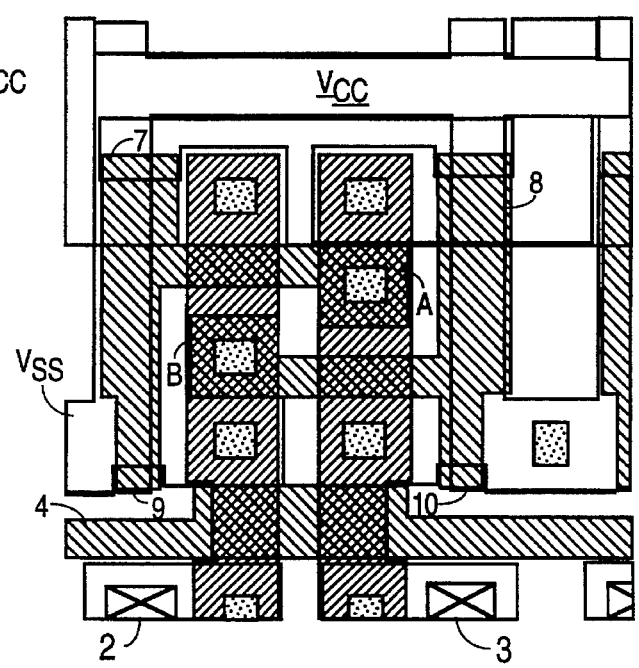
FIG. 2 shows the cell layout of the SRAM cell illustrated in FIG. 1.
Figure 3:
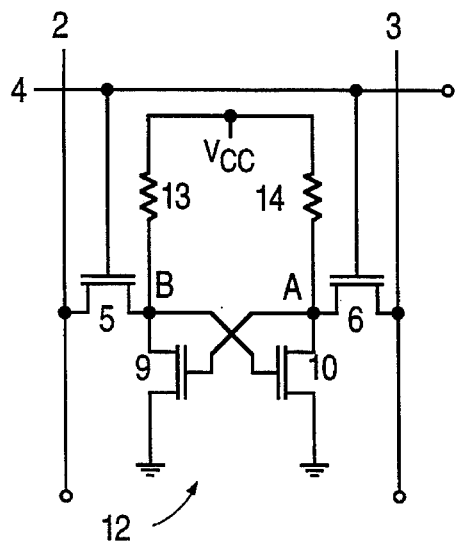
FIG. 3 illustrates a prior art SRAM cell in which polysilicon resistors are used as load devices.
Figure 4:
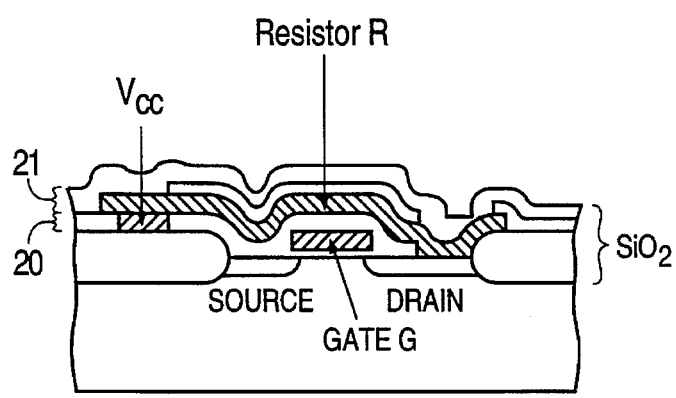
FIG. 4 shows a partial cross-section of the prior art SRAM cell illustrated in FIG. 3.
Figure 7:
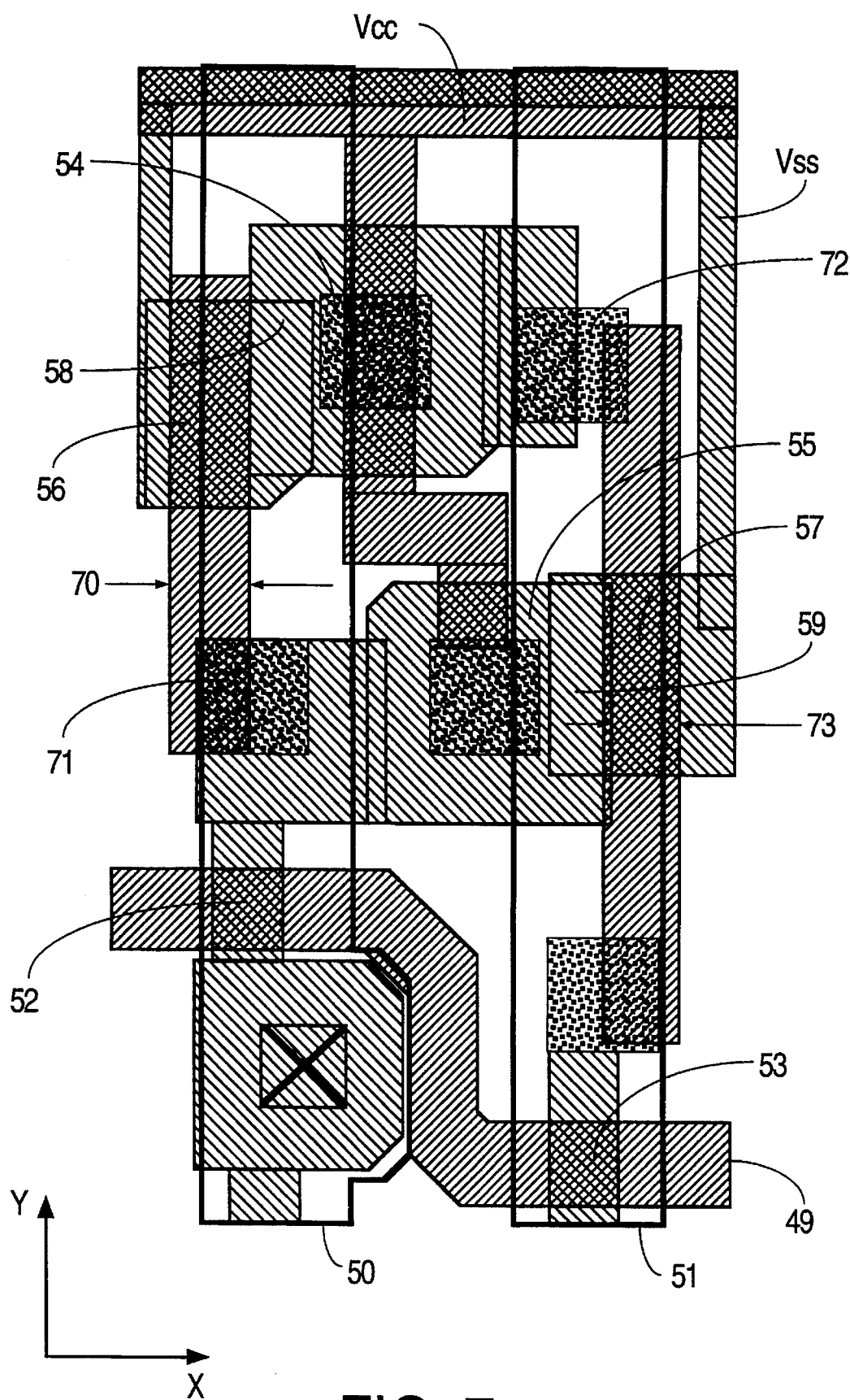
FIG. 7 shows the cell layout of the SRAM cell illustrated in FIG. 5.
Figure 7A:
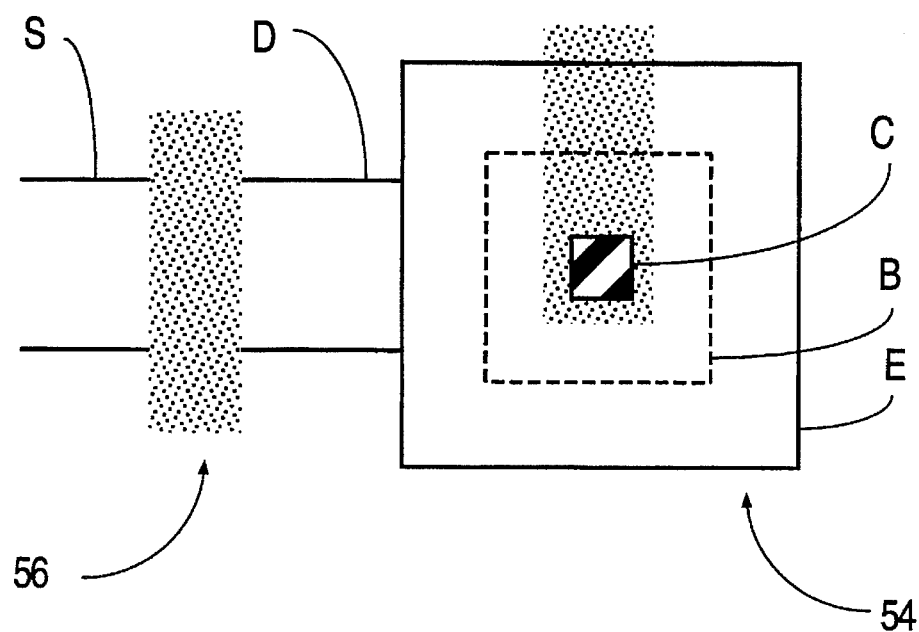
FIG. 7a shows the layout of the butting emitter illustrated in FIG. 5.
Figure 7B:
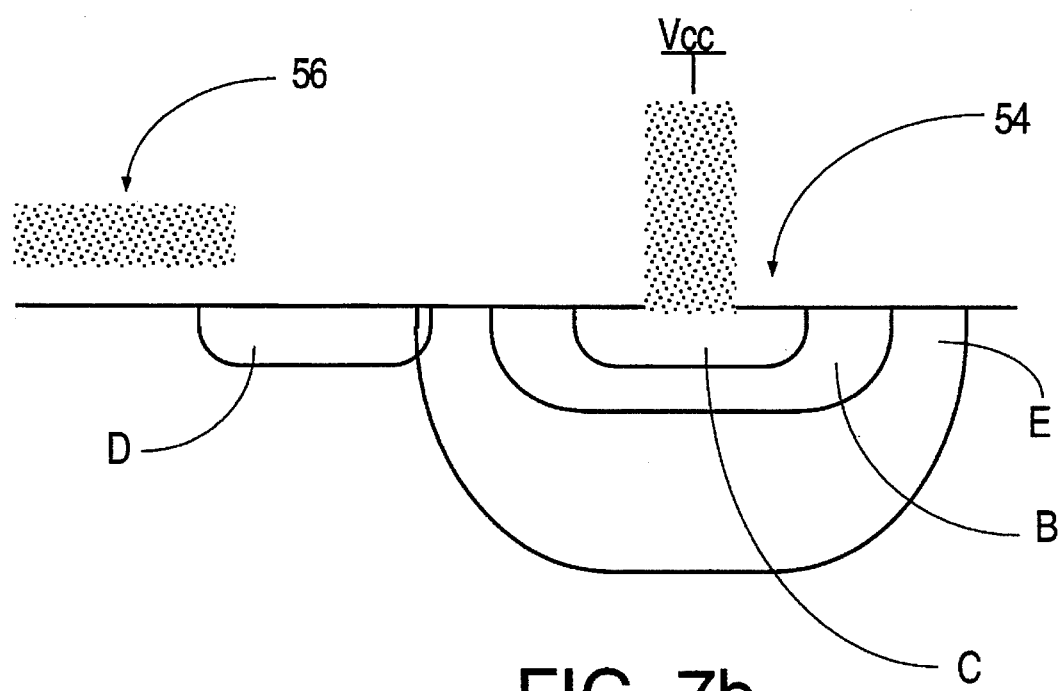
FIG. 7b shows a partial cross-section of the butting emitter illustrated in FIG. 5.

FIG. 7 illustrates one layout for SRAM cell 60 (FIG. 5). In this layout, the drain of pull-down transistor 56 (having a channel length 70) is connected directly to the emitter of transistor 54. As a result the common node 58 is simply the junction of the two N type diffusions of the N+Drain and the N+Emitter of transistors 56 and 54 respectively. No additional interconnect is required (i.e. Poly or Metal) to create common node 58. This yields a very small layout and is referred to as the butting emitter layout style (see FIGS. 7a, 7b). Similar connection is done between pull-down transistor 57 (having a channel length 73) and the bipolar transistor 55 through common node 59. Note that Vcc is supplied by poly to the collectors of 54 and 55 and the VSS is supplied by diffusion to the sources of pull-down transistors 56 and 57. A buried contact 72 is used to connect common node 58 to the gate of pull-down transistor 57. Similarly, a buried contact 71 is used to connect common node 59 to the gate of pull-down transistor 56. All these layout features result in a very compact cell. For example, the width of the cell (measured on the horizontal axis x of FIG. 7) is determined by two metal pitches, i.e. two metal bit lines 50, 51. Thus, this memory cell, having an area of approximately 60μ$^2$ in 0.8μ technology, is substantially smaller than the six-transistor prior art memory cell 1 shown in FIG. 1 which requires a length of five metal pitches and has an area typically of 200μ$^2$.

Figure 8A:
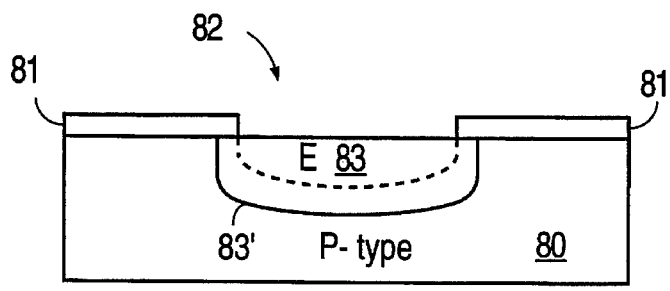
FIGS. 8a–8d show the processing steps for a bipolar transistor in accordance with the present invention.

Bipolar transistors 54 and 55 are formed in the following manner. Referring to FIG. 8a, a silicon substrate 80 is doped with a conventional P-type dopant, such as boron, to a concentration of about $1\times 10^{15}$/cm$^3$ to about $1\times 10^{16}$/cm$^3$. Substrate 80 may be a wafer (bulk) or an epitaxial layer grown on a silicon wafer. Using standard CMOS processing steps, substrate 80 is again doped with boron to create a P-type well (not shown for clarity) with a concentration of about $4\times 10^{16}$/cm$^3$ and approximately 1.5μ deep.

A silicon dioxide layer 81 of about 200Å to 250Å thick is then grown using conventional methods on the surface of substrate 80. Note that this oxide layer 81 in some embodiments also serves as the gate oxide for peripheral transistors. A first masking layer (not shown) is formed using conventional methods on silicon dioxide layer 81 and is patterned to open a window 82 in silicon dioxide layer 81.

An emitter region 83 is then formed through window 82 by implanting an N-type dopant, such as arsenic or phosphorous, at an energy of about 150 keV to 180 keV and a relative dose of $5\times 10^{13}$/cm$^2$ to $5\times 10^{14}$/cm$^2$. The photoresist mask (not shown) blocks the implant from reaching areas of substrate 80 except through window 82. The photoresist mask is then removed. A diffusion step is performed to drive the new emitter region 83' to a depth between 3,000 Å to about 5,000 Å, thereby providing a surface concentration of about $1\times 10^{18}$/cm$^3$ to $1\times 10^{19}$/cm$^3$ and an area of about 1.5 μm by 1.5 μm. Note the formation of the N-well for emitter region 83' is similar to standard CMOS well formation.

Figure 8B:
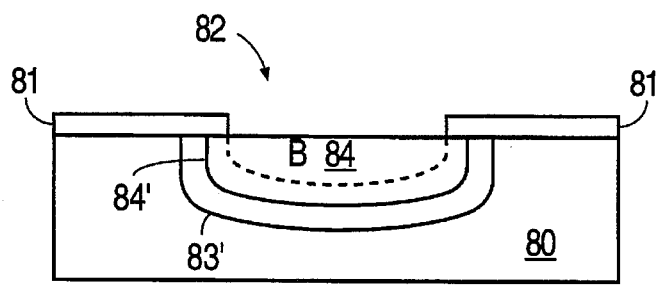

Referring to FIG. 8b, a base region 84 is formed within emitter region 83' by implanting a P-type dopant, such as boron, at an energy of about 25 keV to 50 keV and a relative dosage of $5\times10^{12}/cm^2$ to $5\times10^{13}/cm^2$ through window 82 in oxide layer 81. A conventional diffusion step drives new base region 84' to a depth of about 2,500 Å, thereby providing a surface concentration of about $1\times10^{16}/cm^3$ to $1\times10^{17}/cm^3$ and an area of approximately 1.35 μm ×1.35 μm. Note the concentration ratio of emitter region 83' to base region 84' provides the bipolar transistor amplification β, which in this embodiment is between 10 and 100.

Figure 8C:
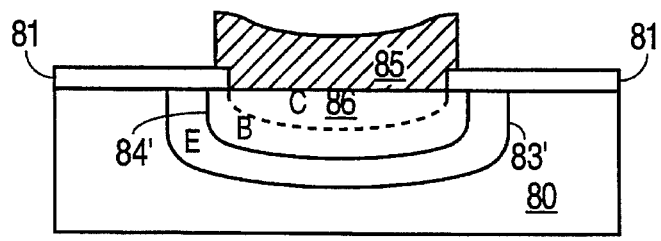

Then, as shown in FIG. 8c, a layer 85 of polycrystalline silicon (polysilicon) is formed over oxide layer 81 and base region 84'. Polysilicon layer 85 is subsequently heavily doped with an N-type dopant, such as phosphorous, and is patterned to form a collector connection to the supply voltage Vcc (not shown). Diffusion of the implanted N-type dopant in polysilicon layer 85 drives some of the N-type dopant into base region 84' to a depth of about 500Å, thereby forming a collector region 86 having a surface concentration of about $1\times10^{20}/cm^3$ and an area about 1.2 μm by 1.2 μm.

To ensure collector region 86 does not punch through base region 84' to emitter region 83', the preceding process steps are tailored carefully. For example, because emitter region 83', base region 84', and collector region 86 are formed through window 82, all of these regions are self-aligned. Thus, the bipolar transistor profile depends on the diffusion cycle sequence. Moreover, boron (used to form base region 84') diffuses faster in silicon than arsenic (used to form collector region 86), thereby further preventing the possibility of punchthrough.

Figure 9:
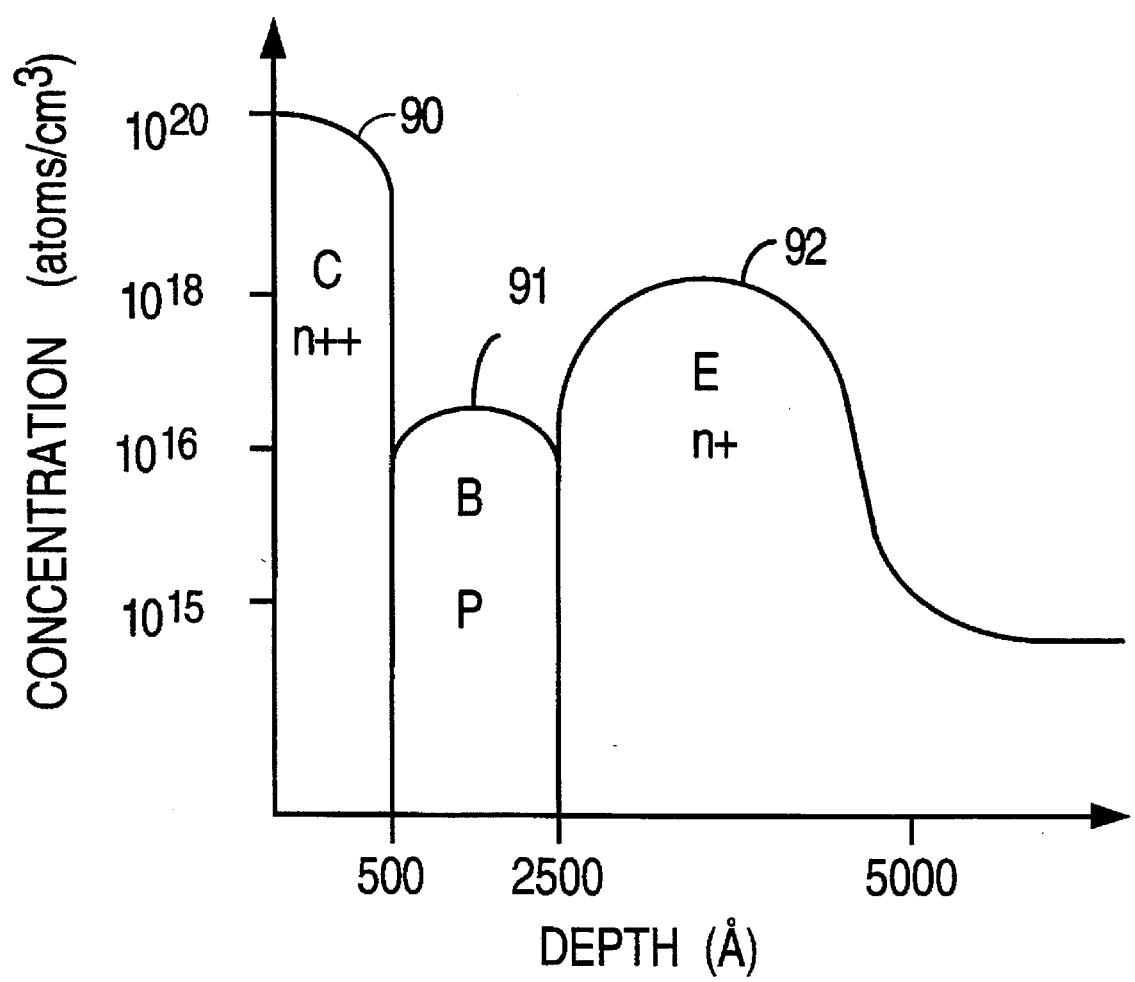
FIG. 9 graphically shows the doping levels for the collector, base, and emitter for a bipolar transistor in one embodiment of the present invention.

The implant concentrations of the bipolar transistor shown in FIG. 8c after diffusion are illustrated graphically in FIG. 9 with the implant concentrations (in atoms/$cm^3$) on the y-axis and implant depth (in Angstroms) on the x-axis. Emitter region 92, as shown in FIG. 9, is implanted about 100 times as intensely as base region 91, thereby providing an amplification β of 100.

Figure 8D:
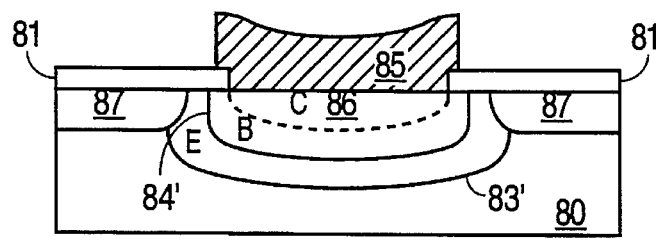

In the next step shown in FIG. 8d, an implantation forms the source/drain regions 87 of N-channel transistors 56 and 57 (FIG. 5). This implant shorts the common node buried layer implant to the emitter region 83'. The source/drain implant is an N-type dopant, such as phosphorus or arsenic, and is performed at an energy of about 50 keV and a dose of $8\times10^{15}/cm^2$. Source/drain regions 87 typically have a surface concentration of about $1\times10^{20}/cm^3$ and a depth of about 4,000 Å.

In a separate set of processing steps, pull-down transistors 56 and 57 (FIG. 5) of memory cell 60 are formed using conventional CMOS processing.

Figure 10:
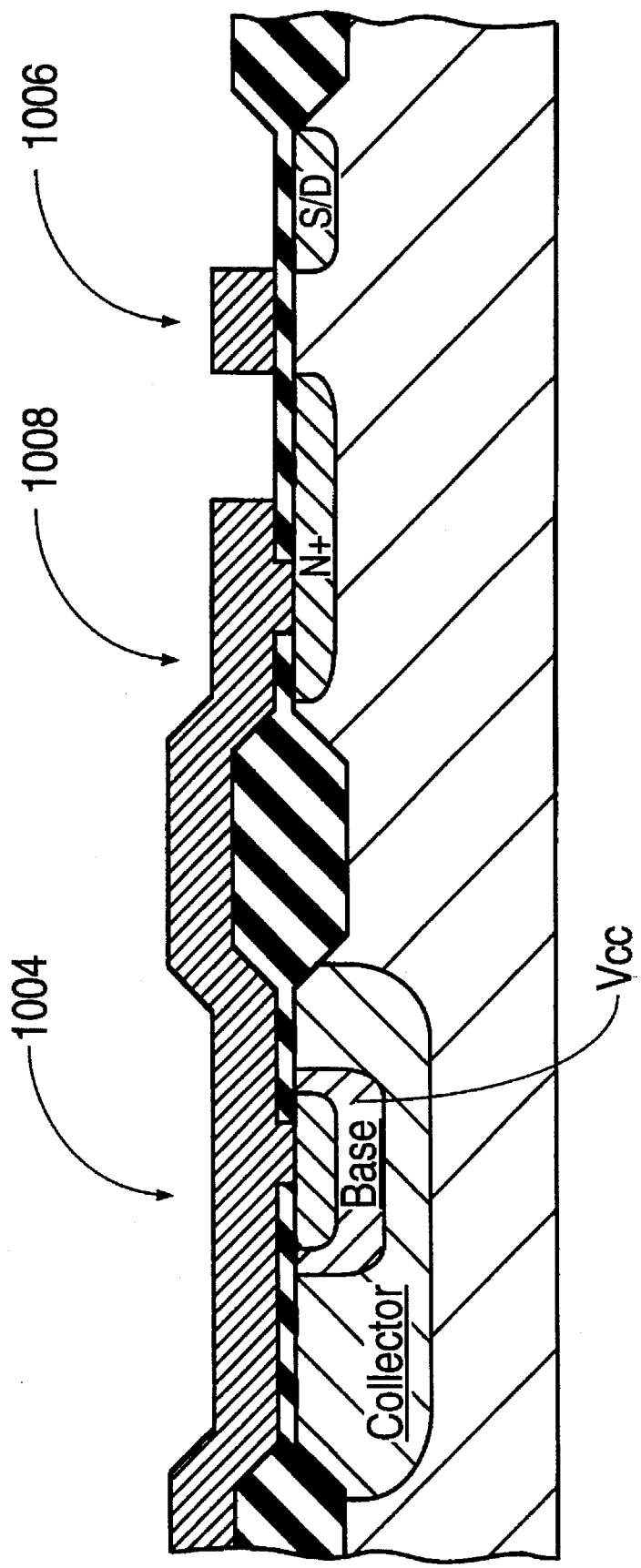
FIG. 10 illustrates a cross-section of a bipolar transistor and an n-channel pulldown transistor, wherein the collector is formed in a well in the substrate and connected to the VCC supply.
Figure 11:
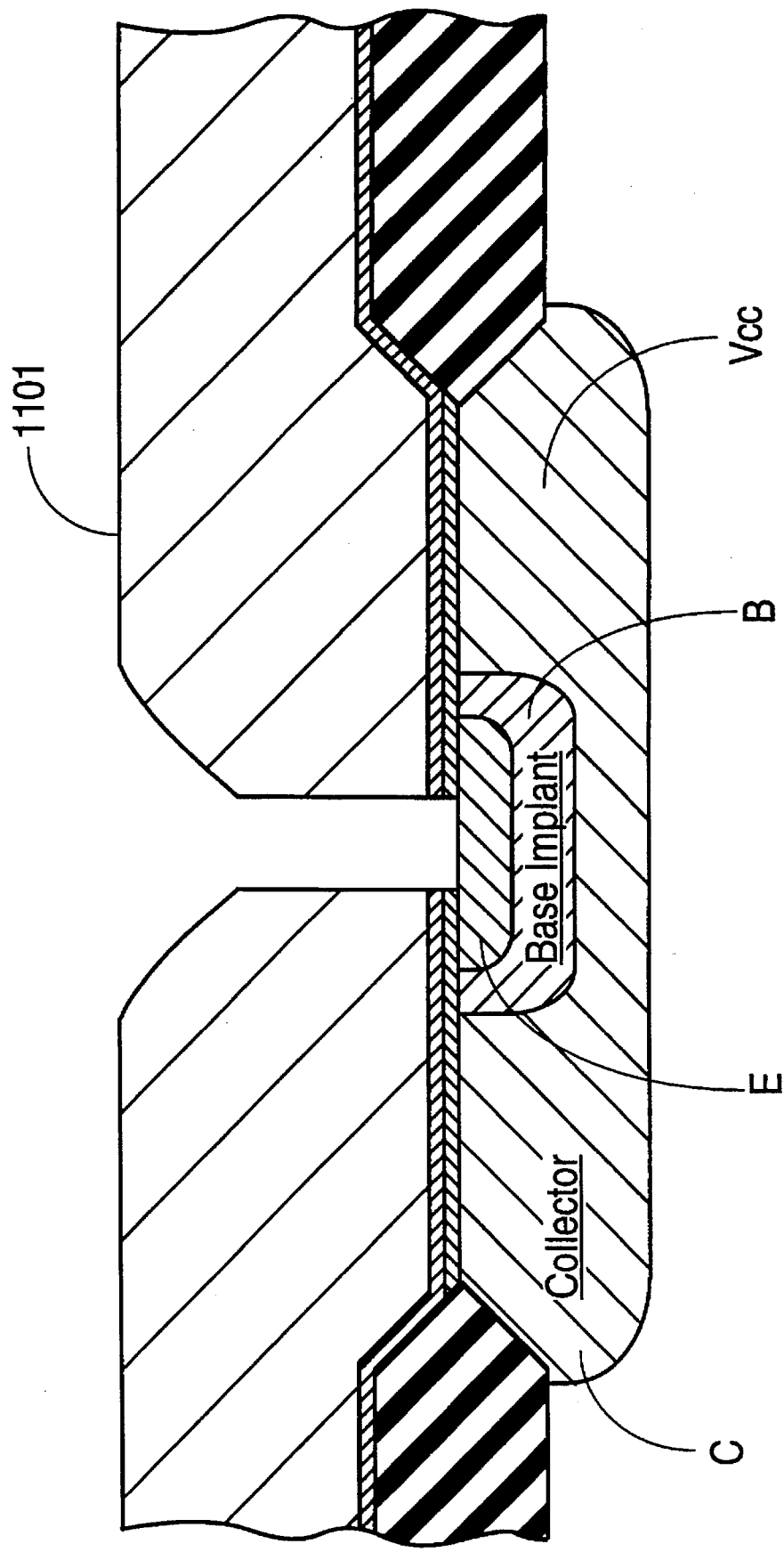
FIG. 11 shows a conventional buried contact mask which is used to perform implants for the base and emitter.
Figure 12:
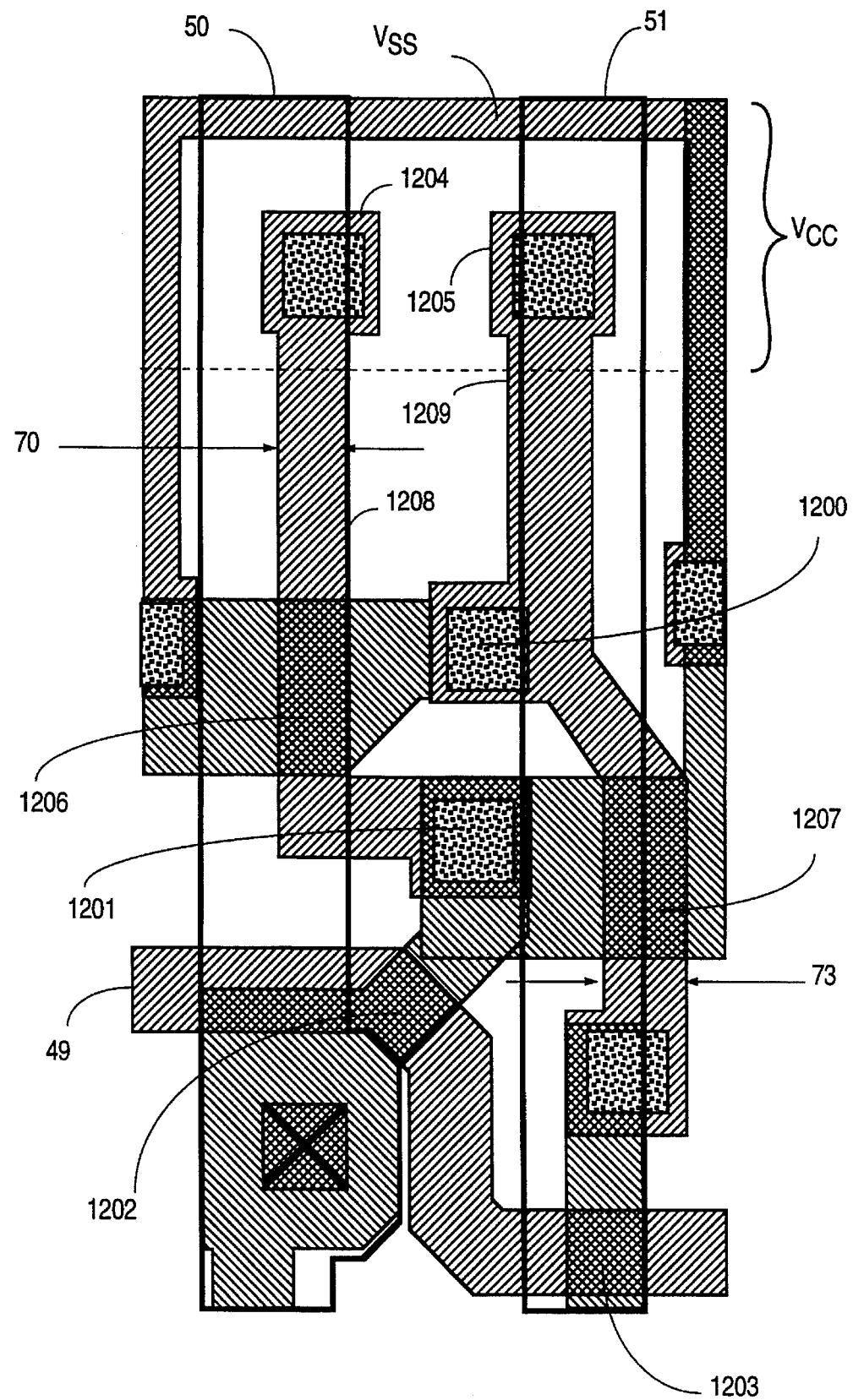
FIG. 12 illustrates a partial layout of one embodiment of a memory cell in accordance with the present invention.
Figure 13:
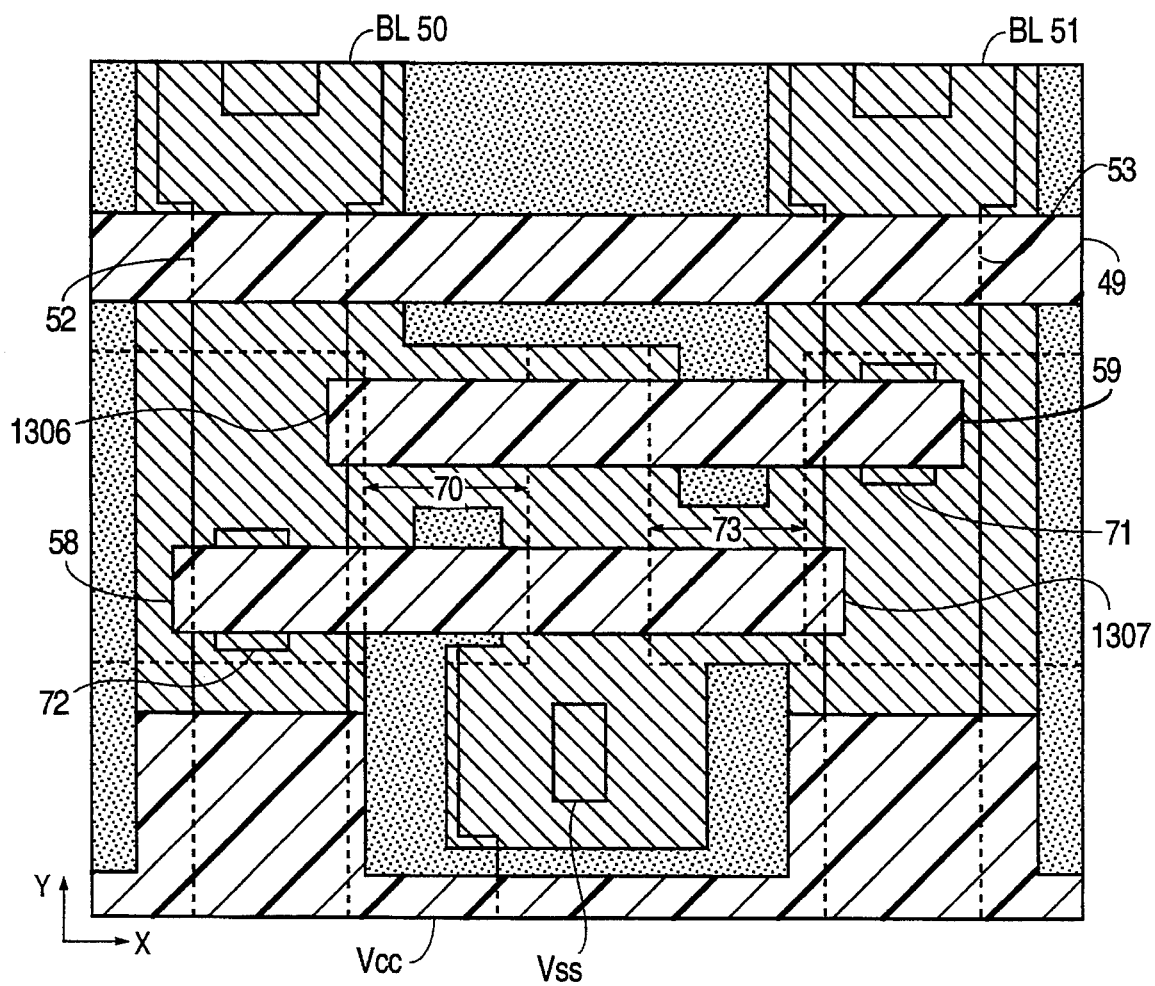
FIG. 13 illustrates a partial layout of another embodiment of a memory cell in accordance with the present invention.

The above description of the invention is illustrative only and not limiting. For example, FIG. 10 illustrates a cross-section of a bipolar transistor 1004 and an n-channel pull down transistor 1006. Note that in this embodiment voltage source Vcc is supplied through the collector well. The collector C, the base B and the emitter E are formed in the opposite sequence detailed in FIGS. 8a–8c. Common node 1008 couples bipolar transistor 1004 to pull-down transistor 1006. Because collector C is formed in the well in the substrate the doping of collector C is low, i.e. typically $5\times10^{16}$ to $1\times10^{17}$ atoms/$cm^3$. In this embodiment, the base B has a doping concentration of 4 to $6\times10^{17}$ atoms/$cm^3$, whereas emitter E has a doping concentration of $1\times10^{19}$ to $1\times10^{20}$ atoms/$cm^3$. Thus, this embodiment provides an easier implant procedure than that described in reference to FIGS. 8a–8d. FIG. 11 shows a conventional buried contact mask 1101, typically photoresist, which is used during the base B and emitter E implants (described in detail in reference to FIG. 8a). FIG. 12 illustrates a partial layout of a memory cell including bipolar transistors 1204 and 1205, pull-down transistors 1206 and 1207, common nodes 1208 and 1209, buried contacts 1200 and 1201, and wordline transfer transistors 1202 and 1203. This layout, using 0.8 micron technology, provides a memory cell typically having a size of approximately 65 μm$^2$ which is significantly smaller than memory cell 1 (FIG. 1) typically having a size of approximately 200 μm$^2$. Using 0.5 micron technology further reduces the size of a memory cell in accordance with the present invention to approximately 30 μm$^2$. Yet another example of the cell layout is shown in FIG. 13. In this embodiment, to minimize the surface area of the SRAM cell, the NMOS pull-down transistors 1306, 1307 are "field-less" transistors, i.e. a transistor in which the gate electrode does not overlap the adjacent field oxide regions. Other embodiments not described herein will be apparent to one skilled in the art and will be within the scope of the invention, as defined by the appended claims.

I claim:

1. A memory cell comprising:

a first transistor and a second transistor, said first transistor coupled between a first node and a first voltage source and having a first leakage current, said second transistor coupled between a second node and said first voltage source and having a second leakage current; and a first bipolar transistor and a second bipolar transistor, said first bipolar transistor coupled between said first node and a second voltage source, and said second bipolar transistor coupled between said second node and said second voltage source, wherein said first node is coupled to said second transistor and said second node is coupled to said first transistor, wherein said first and second bipolar transistors have open bases to compensate for said leakage current of said first and second transistors, respectively.

2. The memory cell of claim 1 wherein each of said bipolar transistors comprises:

an emitter region formed in a semiconductor substrate;

a base region formed in said emitter region; and a collector region formed in said base region.

3. The memory cell of claim 2 wherein each of said bipolar transistors includes a base region only electrically in direct contact with an emitter region and a collector region of said bipolar transistor.

4. The memory cell of claim 3 wherein said collector region of each of said bipolar transistors is electrically contacted by a contact formed on said substrate.

5. The memory cell of claim 1 wherein each of said bipolar transistors provides a load current which is a function of said leakage current.

6. The memory cell of claim 2, wherein each of said first and second transistors includes a gate, a source, and a drain, said drain of said first transistor being connected to said gate of said second transistor and said first node, and said drain of said second transistor being connected to said gate of said first transistor and said second node, said sources of said first transistor and said second transistor being connected to said first voltage source, said leakage current being provided to the drains of said first and second transistors.

7. The memory cell of claim 6 wherein said first and said second transistors are n-channel transistors.

8. The memory cell of claim 7 wherein said first and second bipolar transistors are NPN bipolar transistors.

9. The memory cell of claim 6 wherein said first and said second transistors are p-channel transistors.

10. The memory cell of claim 9 wherein said first and second bipolar transistors are PNP bipolar transistors.

11. The memory cell of claim 6 further comprising an input line for providing a signal to said memory cell to change said memory cell from a first logic state to a second logic state, wherein said input line is connected to said drain of said first transistor.

12. A memory cell comprising:

a first transistor and a second transistor, said first transistor coupled between a first node and a first voltage source and having a first leakage current, said second transistor coupled between a second node and said first voltage source and having a second leakage current;

a first bipolar transistor and a second bipolar transistor, said first bipolar transistor coupled between said first node and a second voltage source, and said second bipolar transistor coupled between said second node and said second voltage source, wherein said first node is coupled to said second transistor and said second node is coupled to said first transistor, wherein said first and second bipolar transistors have open bases to compensate for said leakage current of said first and second transistors, respectively; and an input line for providing a signal to said memory cell to change said memory cell from a first logic state to a second logic state, wherein said input line is connected to said first node.

13. The memory cell of claim 12 wherein each of said bipolar transistors comprises:

an emitter region formed in a semiconductor substrate;

a base region formed in said emitter region; and a collector region formed in said base region.

14. The memory cell of claim 13 wherein each of said bipolar transistors includes a base region only electrically in direct contact with an emitter region and a collector region of said bipolar transistor.

15. The memory cell of claim 14 wherein said collector region of each of said bipolar transistors is electrically contacted by a contact formed on said substrate.

16. The memory cell of claim 12 wherein each of said bipolar transistors provides a load current which is a function of said leakage current.

17. The memory cell of claim 12, wherein each of said first and second transistors includes a gate, a source, and a drain, said drain of said first transistor being connected to said gate of said second transistor and said first node, and said drain of said second transistor being connected to said gate of said first transistor and said second node, said sources of said first transistor and said second transistor being connected to said first voltage source, said leakage current being provided to the drains of said first and second transistors.

18. The memory cell of claim 17 wherein said first and said second transistors are n-channel transistors.

19. The memory cell of claim 18 wherein said first and second bipolar transistors are NPN bipolar transistors.

20. The memory cell of claim 17 wherein said first and said second transistors are p-channel transistors.

21. The memory cell of claim 20 wherein said first and second bipolar transistors are PNP bipolar transistors.

22. The memory cell of claim 12 wherein each of said bipolar transistors comprises an emitter region formed in a semiconductor body, and a base region formed in said emitter region, wherein a current provided by said bipolar transistor is proportional to a concentration of charges in said emitter region divided by a concentration of charges in said base region.

23. A memory cell comprising:

a first and a second bipolar transistor both formed in a semiconductor substrate, each bipolar transistor having an emitter, a base and a collector region, said base region being formed within the respective emitter region and only electrically connected to said emitter and said collector region;

a first pull-down transistor and a second pull-down transistor both formed in said semiconductor substrate, each pull-down transistor having a drain, a source, and a gate;

means for connecting said emitter region of said first bipolar transistor to said drain of said first pull-down transistor and to said gate of said second pull-down transistor;

means for connecting said emitter region of said second bipolar transistor to said drain region of said second pull-down transistor and to said gate of said first pull-down transistor;

and means for providing an input signal to said gates of said first transistor and said pull-down second transistors to change said memory cell from a first logic state to a second logic state.

24. The memory cell of claim 12 wherein each of said bipolar transistors comprises:

a collector region formed in a well connected to said second voltage source, wherein the well is formed in a semiconductor substrate; and a base region formed in said collector region; and an emitter region formed in said base region.

25. The memory cell of claim 24 wherein said emitter region of each of the bipolar transistors is electrically contacted.

* * * * *